United States Patent [19]
Silfvast et al.

[11] Patent Number: 5,963,616
[45] Date of Patent: *Oct. 5, 1999

[54] CONFIGURATIONS, MATERIALS AND WAVELENGTHS FOR EUV LITHIUM PLASMA DISCHARGE LAMPS

[75] Inventors: William T. Silfvast, Helena, Calif.; Marc A. Klosner, Orlando, Fla.

[73] Assignee: University of Central Florida, Orlando, Fla.

[*] Notice: This patent is subject to a terminal disclaimer.

[21] Appl. No.: 08/815,283

[22] Filed: Mar. 11, 1997

[51] Int. Cl.$^6$ ........................................... H01J 35/00
[52] U.S. Cl. ......................... 378/122; 378/119; 250/504
[58] Field of Search ................... 378/119, 122; 250/504

[56] References Cited

U.S. PATENT DOCUMENTS

| | | | |
|---|---|---|---|
| 4,229,708 | 10/1980 | Mani et al. | 331/94.5 G |
| 4,538,291 | 8/1985 | Iwamatsu | 378/119 |
| 4,592,056 | 5/1986 | Elton | 372/5 |
| 4,860,328 | 8/1989 | Frankel et al. | 378/34 |
| 4,872,189 | 10/1989 | Frankel et al. | 378/119 |
| 5,117,432 | 5/1992 | Nilsen | 372/5 |
| 5,177,774 | 1/1993 | Suckewer et al. | 378/43 |
| 5,243,638 | 9/1993 | Wang et al. | 378/119 |
| 5,327,475 | 7/1994 | Golovanivsky et al. | 378/34 |
| 5,499,282 | 3/1996 | Silfvast | 378/119 |

OTHER PUBLICATIONS

HE–CD Lasers Using Recirculations Geometry, Karl G. HernQvist, *IEEE Journal of Quantum Electronics*, vol. Qe–9, No. 9, Sep. 1972, pp. 740–743.

Review on Corrosion Phenomena in Molten Lithium, P.A. Steinmeyer, et al., pp. 349–434.

Degradation of Silicon Carbide by Molten Lithium, James W. Cree, et al. *Communications of the American Ceramic Society*, Nov. 1987, pp. C–318—C321.

Compatibility of Ceramics with Liquid Na and Li, R. N. Singh, *Journal of the American Ceramic Society*, vol. 59, No. 3–4 pp. 112–114.

Wavelength Considerations in Solft–X–Ray Projection Lithography, Andrew M. Hawryluk, et al., *Applied Optics*, vol. 32, No. 34, Dec. 1, 1993, pp. 7062–7067.

Molybdenum/Beryllium Multilayer Mirrors for Normal Incidence in the Extreme Ultraviolet, K.M. Skulina, et al., *Applied Optics*, vol. 34, No. 19, Jul. 1, 1995, pp. 3727–3730.

Ion Lasers Deliver Power at Visible and UV Wavelengths, Jeff Hecht, Laser Focus World, Dec. 1992, pp. 97–98.

Stabilite 2017, General Purpose Ion Laser, Spectro–Physics Lasers.

Silfvast, et al. Simple Metal–Vapor Recombination Lasers Using Segmented Plasma Excitation, Applied Physics Letters 36(8), Apr., 1980, pp. 615–661.

Marconi, et al., Time–Resolved Extreme Ultraviolet Emission From a Big Ionized Lithium Capillary Discharge, Applied Physics Letters, 54(22), May, 1989, pp. 2180–2182.

Rocca, et al., Study of the Soft X–Ray Emission From Carbon Ions in Capillary Discharge, IEEE Journal Quantum Electronics, vol. 29#1, Jan. 1983, pp. 182–191.

Silfvast, et al., Laser Plasma Source Charactization for SXPL, OSA Proceedings on Soft–X–Ray Proj. Lithog. vol. 18, Jan. 1994, pp. 117–126.

Nagata, et al., Soft–X–Ray Amplification of the Lyman Transition by Optical–Field–Induced Ionization, American Physical Society, vol. 71, #23, Dec. 1983, pp. 3774–3777.

Silfvast, William T., Development of Efficient Narrow Spectral Width Soft–X–Ray Sources at 13.5 nm, Creol, University of Central Florida, Jan. 1994, pp. 1–5.

*Primary Examiner*—Craig E. Church
*Attorney, Agent, or Firm*—Brian S. Steinberger; Law Offices of Brian S. Steinberger

[57] ABSTRACT

This invention relates to Lithium Plasma discharge sources, and in particular to methods of making and producing pulsed and continuous discharge sources for plasma soft-x-ray or EUV projection lithography. Specifically, novel configurations, metal and ceramic material combinations and efficient wavelengths over and including 11.4 nm are disclosed for EUV lithium plasma discharge lamps.

17 Claims, 13 Drawing Sheets

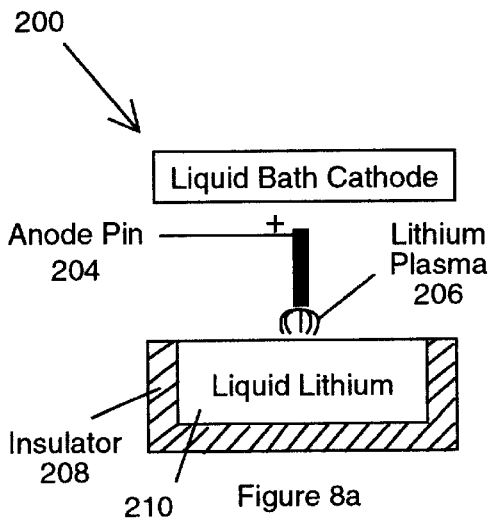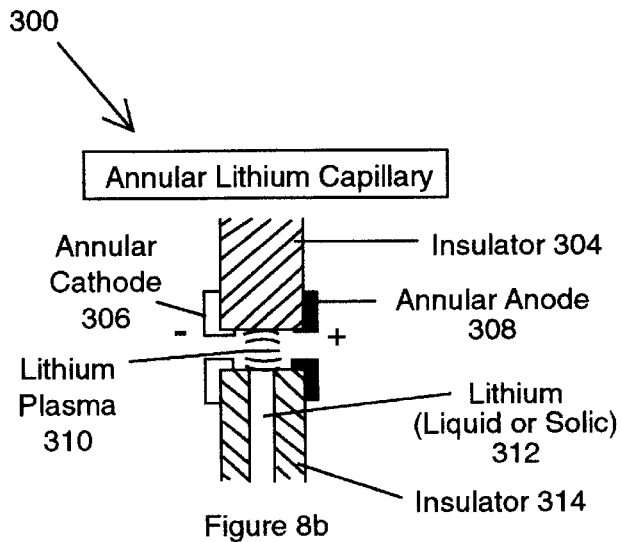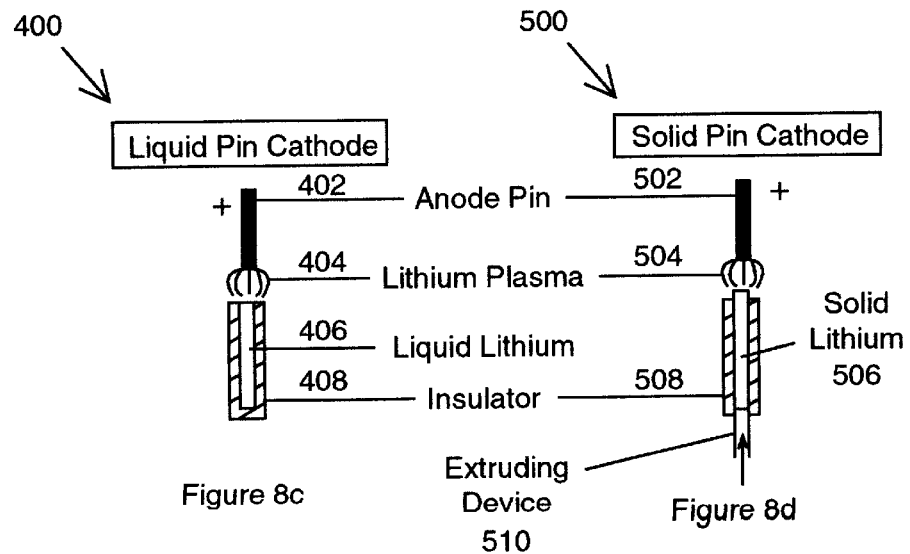

Fig. 12 Recirculating lithium cell
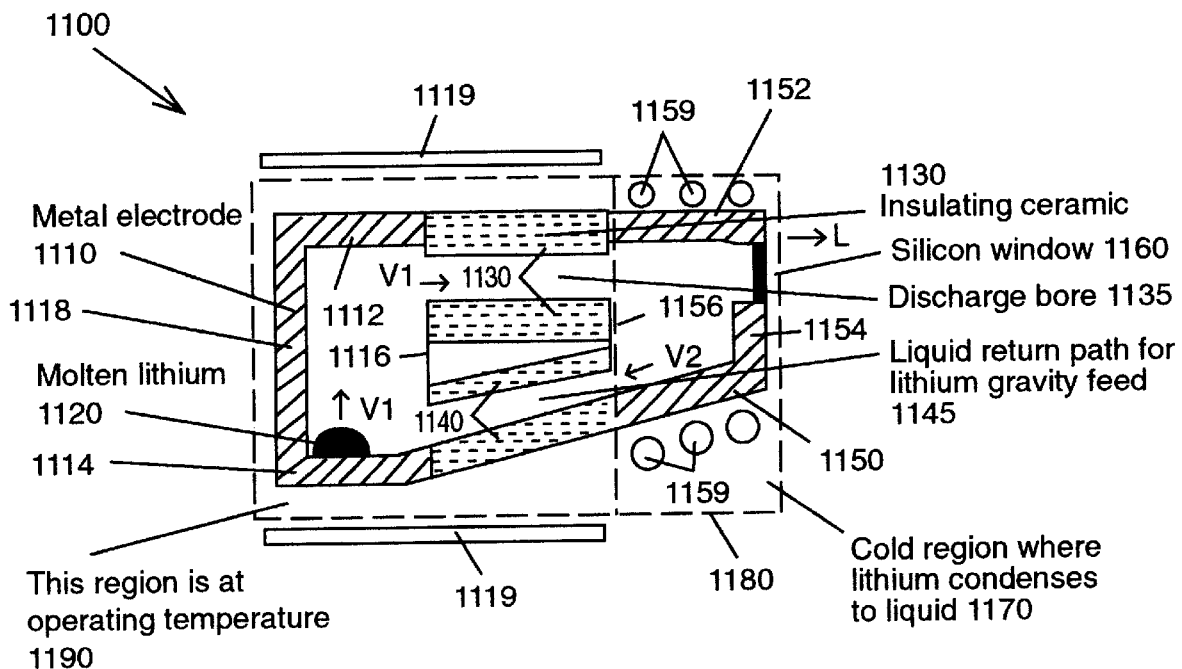
Fig. 13 static lithium cell (non-recirculating geometry)
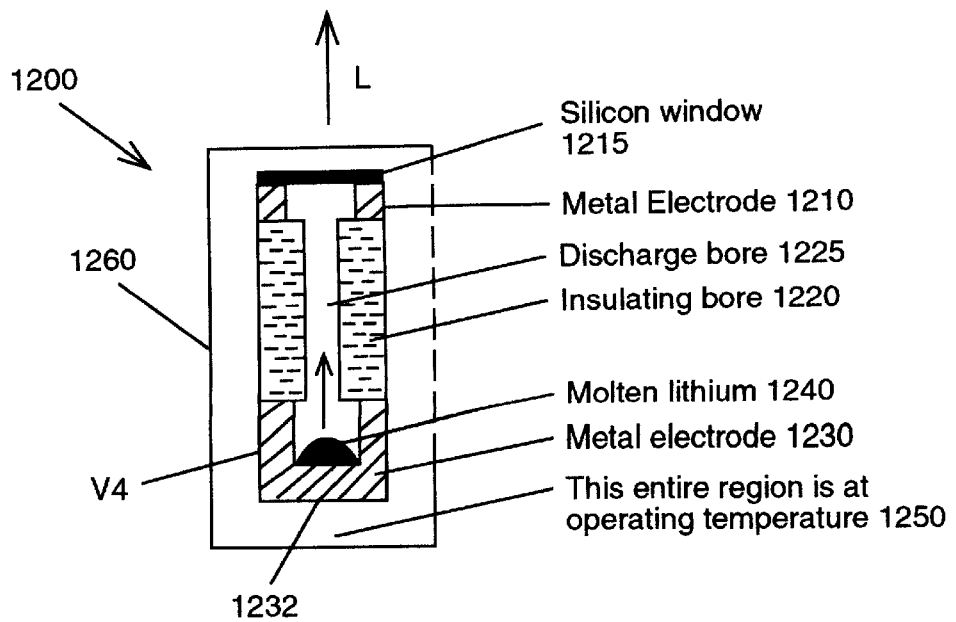

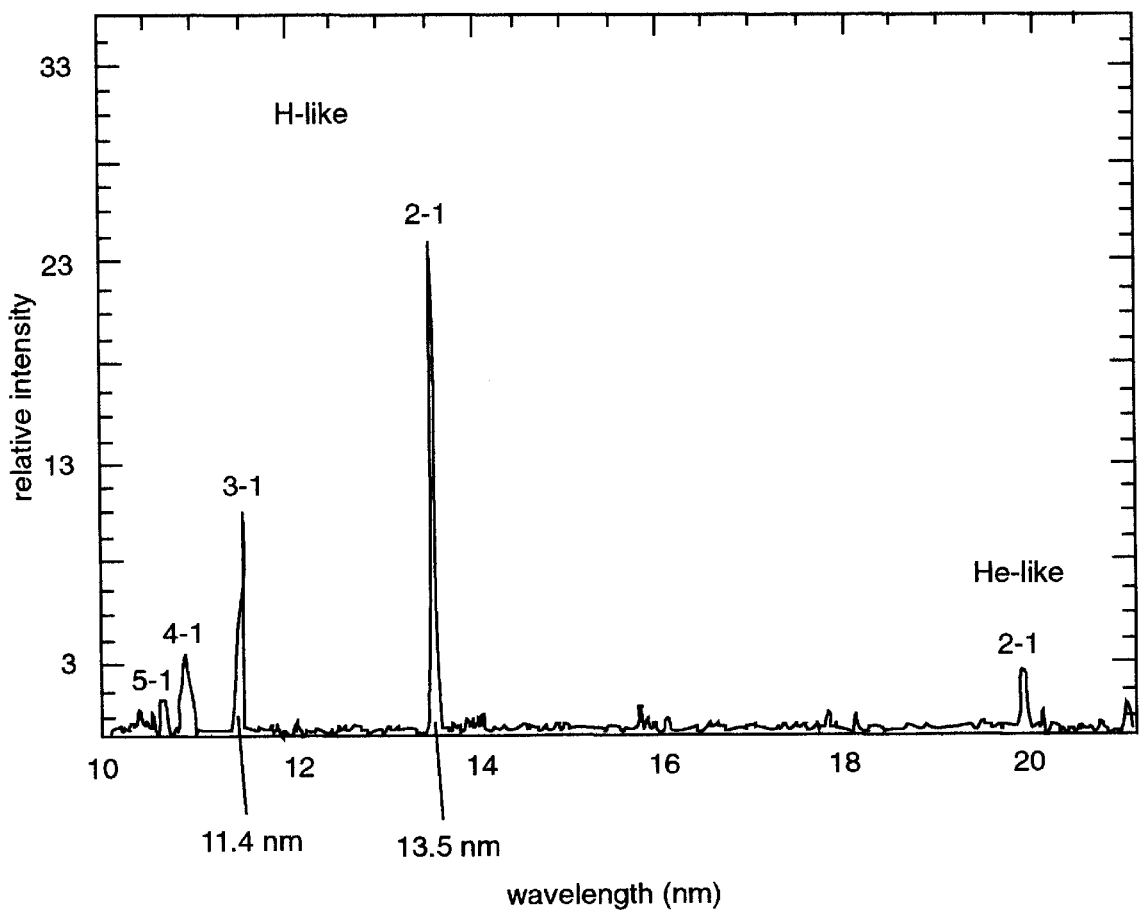
Fig. 14 Lithium Spectrum

CONFIGURATIONS, MATERIALS AND WAVELENGTHS FOR EUV LITHIUM PLASMA DISCHARGE LAMPS

This invention relates to Lithium Plasma discharge sources, and in particular to methods of making and producing pulsed and continuous discharge sources for plasma soft-x-ray or EUV projection lithography. This invention was funded in part under contract no. 6503808 from D.O.E. and Sandia National Laboratories and under contract no. 6503810 from A.R.P.A. and Sandia National Laboratories. This invention is related to U.S. Pat. No. 5,499,282 to William T. Silfvast issued on Mar. 12, 1996, which is incorporated by reference.

BACKGROUND AND PRIOR ART

For soft x-ray or EUV projection lithography there is a need for a soft x-ray plasma source that can radiate within a specific wavelength of approximately 11 to approximately 14 nm in the EUV part of the spectrum.

Current approaches to the development of an efficient 11–14 nm plasma light source for EUV lithography involve a high repetition-rate laser plasma source produced by the ablation of the source material from a solid target. Such a system falls short of satisfying the needed requirements for EUV lithography in several respects. First, the mass buildup of debris target material on the surface of a condenser mirror used in the lithography systems is many orders of magnitude (greater than $10^3$) larger than the mirror can sustain without loss of reflectivity over a reasonable operating period. Second, the spectral bandwidth of the EUV emission from the plasma is greater than the bandwidth of the multilayer mirror by a large factor, and thus the majority of the EUV emission is absorbed by the mirror. At the repetition rate of a testbed facility the thermal loading of this absorbed energy is sufficient to deform the mirror and degrade its reflectivity. Finally, no engineered scheme has yet been proposed that would guarantee continuous, unimpeded operation of a kilohertz repetition rate target facility at the required predicted cost per shot requirement of less than \$$10^{-5}$/shot.$^3$ The region of approximately 11.4 nm is a desirable wavelength for lithography, specifically for example in molybdenum and beryllium multilayer mirrors. See for example: Skulina et al. "Molybdenum/beryllium multilayer mirrors for normal incidence in the extreme ultraviolet", Jul. 1, 1995, Vol. 34, No. 19, Applied Optics pages 3727–3730; and Hawryluk et al., "Wavelength considerations in soft-x-ray projection lithography", Dec. 1, 1993, Vol. 32, No. 34, Applied Optics, Pages 7062–7067.

The region of 13-14 nm is currently the preferable wavelength range for applications using soft-x-ray light because it is the region of maximum reflectivity of narrow-banded Mo:Si reflective coatings used in conjunction with near normal incidence soft-x-ray reflecting optics. There are currently no compact, efficient continuous or pulsed sources available in this spectral region. For example, the most likely source being presently considered for soft-x-ray or EUV lithography operating in that wavelength region is a pulsed laser produced plasma source generated by a 1 kHz repetition rate, 1 J/pulse diode pumped solid state laser which was described by this inventor in the article entitled: "Laser-Produced Plasmas for Soft-X-Ray Projection Lithography," W. T. Silfvast, M. C. Richardson, et.al., J. Vac. Sci. Technol. B10, 1 (1992). That laser would emit a power at 13 nm of approximately 10 W and would cost well over a million dollars, primarily due to the cost of the laser diodes required to pump the laser. Furthermore, such a laser source would have a wallplug efficiency of less than 0.1%. The lithium source disclosed in this invention would emit the same power at an electron density of $2.5 \times 10^{17}$/cm$^3$, and would have a wallplug efficiency of the order of 10%. It would probably cost in the neighborhood of up to approximately \$100,000. The lithium source would be extremely compact, would be more similar to the G-line and I-line mercury arc lamps currently used for lithography, in terms of its size and efficiency, than to a laser plasma source, and would probably cost in the neighborhood of up to approximately \$100,000.

Other sources that have been used include synchrotons which can cost upwards of ten million dollars. Synchrotons sources require large, costly facilities and are expensive to maintain.

Thus, the need exists for a plasma source for generating pulsed or continuous emission that does not require large, costly facilities that are expensive, that are efficient in the approximately 11 to approximately 14 nm wavelength region and that do not produce a significant amount of debris.

SUMMARY OF THE INVENTION

The first objective of the present invention is to provide an inexpensive pulsed or continuous wave discharge source capable of operating in the range of approximately 11.4 nm.

The second object of this invention is to provide a compact pulsed or continuous wave discharge source capable of operating in the range of approximately 11.4 nm.

The third object of this invention is to provide an efficient pulsed or continuous wave discharge source capable of operating in the range of approximately 11.4 nm.

The fourth object of this invention is to provide a discharge source capable of operating in the range of approximately 11.4 nm that does not produce damaging debris.

The fifth object of this invention is to generate a narrow band EUV radiation source.

The sixth object of this invention is to generate a lithium plasma using lithium vapor within a ceramic insulator between refractory metal electrodes.

The seventh object of this invention is to generate a lithium plasma using a lithium vapor between a conductor region and a segmented insulating bore where alternating segmented disks having interior facing tungsten tips/rings/edges or other high melting point materials are separated from one another by insulating disk segments.

The eighth object of this invention is to provide a closed loop cycle circulation path for the lithium within the lithium discharge source. It will consist of having an insulating bore within the electrode casing forming a discharge bore for the lithium source and a separate return path through a region of higher electrical impedance compared to the impedance of the discharge bore.

Further objects and advantages of this invention will be apparent from the following detailed description of a presently preferred embodiment which is illustrated schematically in the accompanying drawings.

BRIEF DESCRIPTION OF THE FIGURES

FIG. 8a illustrates a liquid bath cathode for a pulsed lithium source.

FIG. 8b illustrates an annular lithium capillary for a pulsed lithium source.

FIG. 8c illustrates a liquid pin cathode for a pulsed lithium plasma source.

FIG. 8d illustrates a solid pin cathode for a pulsed lithium plasma source.

FIG. 12 shows a side cross-sectional view of metal electrodes and ceramic insulating bore combination having a recirculating lithium cell, used as a lithium plasma discharge source.

FIG. 13 shows a side cross-sectional view of a metal electrodes and ceramics combination with a static lithium cell, used as a lithium plasma discharge source.

FIG. 14 shows a lithium plasma spectrum of intensity vs. wavelength.

DESCRIPTION OF THE PREFERRED EMBODIMENT

Before explaining the disclosed embodiment of the present invention in detail it is to be understood that the invention is not limited in its application to the details of the particular arrangement shown since the invention is capable of other embodiments. Also, the terminology used herein is for the purpose of description and not of limitation.

Figure 1:
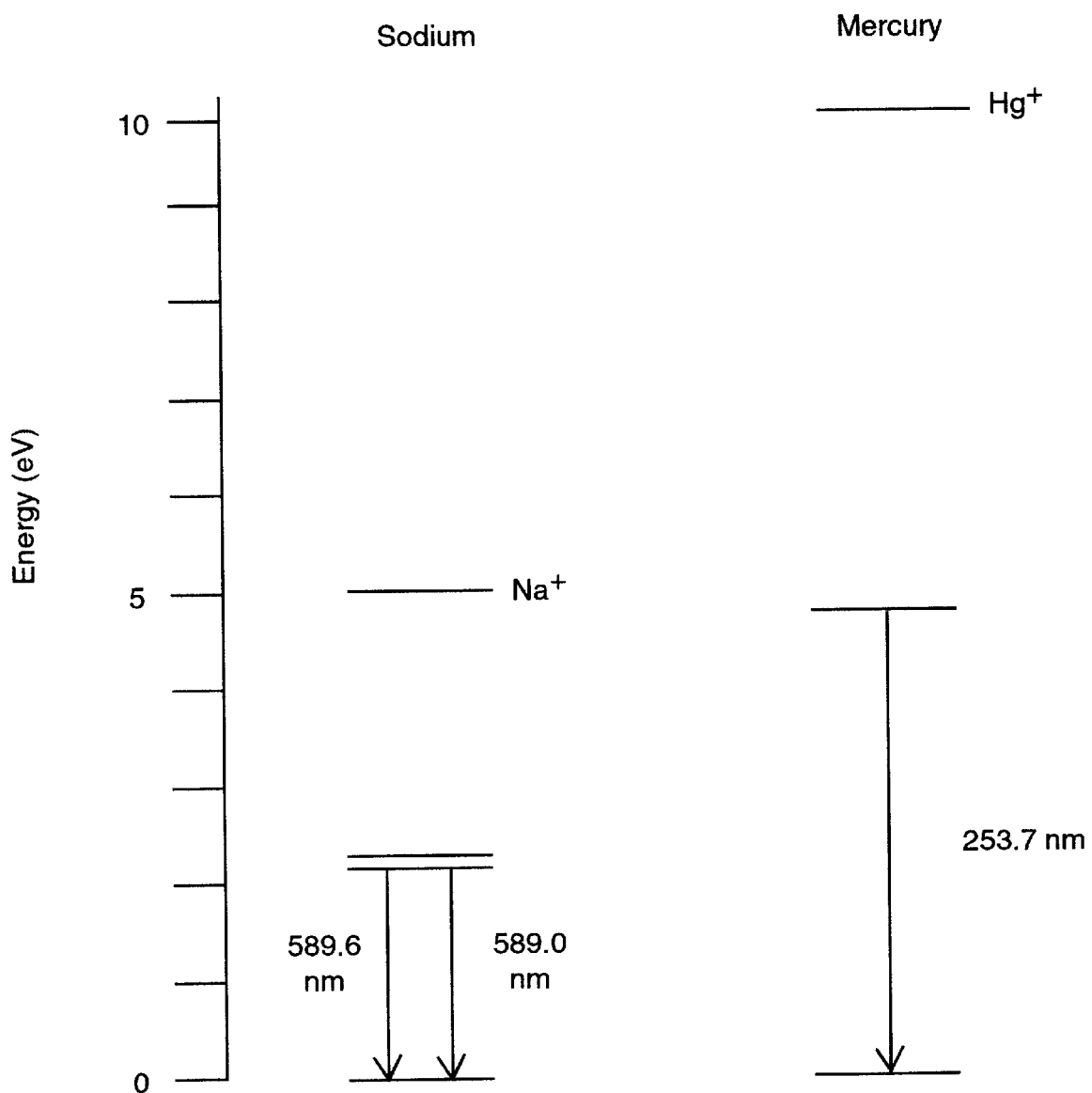
FIG. 1 shows a graph of the prior art radiation wavelengths with corresponding energy diagrams for mercury and sodium vapor discharge lamp sources.

The sources disclosed in this invention were developed by considering the operation of low pressure mercury and sodium vapor discharge lamps which are two of the most efficient light sources ever developed. FIG. 1 shows the radiation in wavelength of both mercury and sodium vapor discharge lamps. Referring to FIG. 1, the mercury lamp radiates at 253.6 nm and the sodium lamp radiates at 589.0 nm and 589.6 nm. In both cases the radiation is emitted on resonance transitions (from the first optically connected excited state to the ground state) of their respective atoms. The shortest wavelength for resonance radiation in atomic species is the $^1P_1$ to $^1S_0$ helium transition at 58.4 nm which is not of sufficiently short wavelength to be considered a soft-x-ray source. Thus, to develop efficient soft-x-ray sources of the same type as the mercury and sodium lamps, it is necessary to produce them in ionized species. This involves heating the plasma consisting of electrons and ions to a specific temperature to obtain a specific ion stage from which to produce excitation at a desired resonance level.

For identifying efficient pulsed and continuous wave sources in plasmas requires two steps.
(1) Recognize an ion species with a resonance transition that has a high ratio of photon energy to ionization potential of that particular ion species to minimize wasted excitation; and
(2) Identify an ion species having the fewest number of electrons removed from the atom, thereby minimizing the energy required to heat the total number of ions and free electrons of the plasma.

The first section will describe identifying pulsed sources in plasmas requiring the above two steps.

PULSED DISCHARGE SOURCES

The first step is satisfied by choosing hydrogen-like species (species with only one electron orbiting around the nucleus). In such cases the energy of the resonance transition comprises 75% of the ionization energy of the atom. The wavelength of transitions associated with resonance lines of H-like ions can be expressed as $\lambda_{res}=121.6$ nm/$Z^2$ where Z is the charge on the nucleus of the ion.

For satisfying the second step Z should be a minimum value since the factor (Z-1) represents the number of free electrons per ion of the desired radiating species produced in the plasma for H-like ions (assuming charge neutrality).

For Z=2, or He+, $\lambda_{res}$=30.4 nm which is too long a wavelength for most applications using soft-x-ray optics. In addition, He+ would have to be generated in a background gas of He which strongly absorbs the 30.4 nm radiation by photo-ionization. A source of this class occurs for Z=3 which would be a $Li^{2+}$ resonance source at 13.5 nm, near the peak reflectivity of efficient high-reflecting Mo:Si mirrors. For Z=4 we have a $Be^{3+}$ source at 7.60 nm. For Z=5 there is a $B^{4+}$ source at 4.86 nm and for Z=6 we have a $C^{5+}$ source at 3.38 nm.

Figure 2:
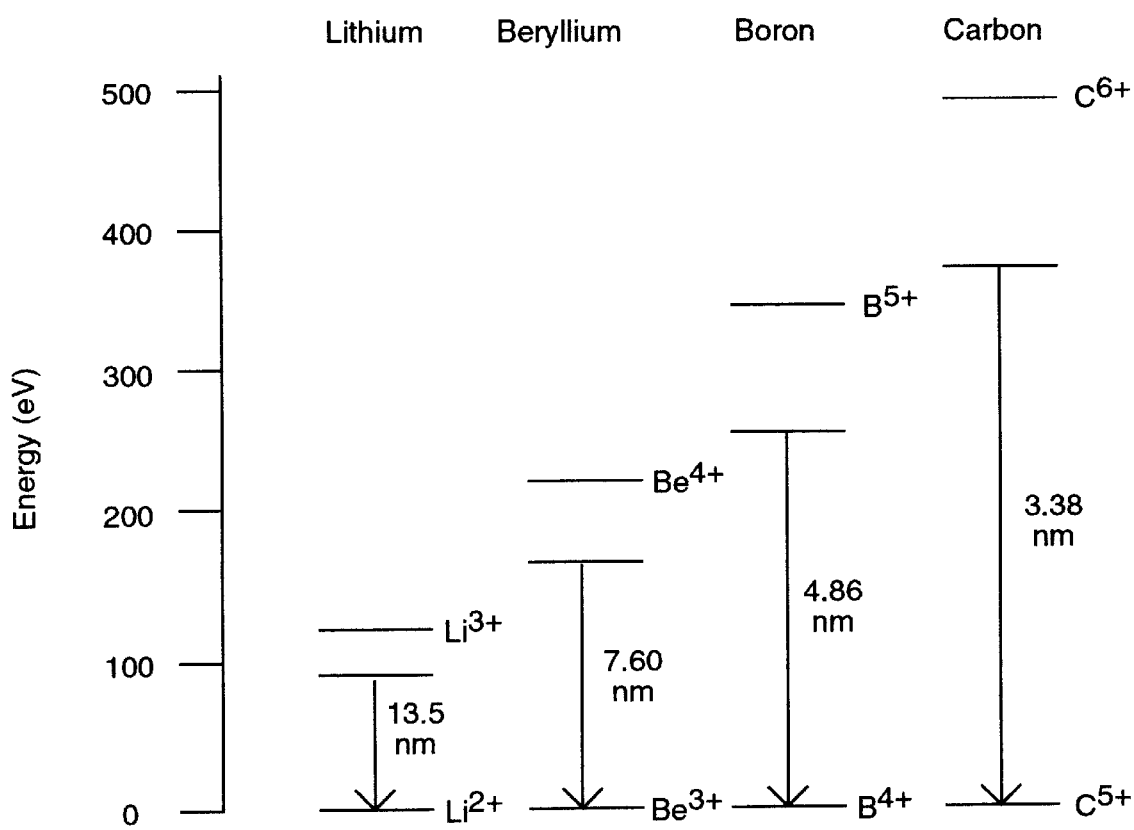
FIG. 2 shows the radiation wavelengths with corresponding energy diagrams for Lithium, Beryllium, Boron and Carbon according to the invention.

FIG. 2 shows the radiation wavelengths with corresponding energy diagrams for Lithium, Beryllium, Boron and Carbon. They all involve hydrogen-like resonance radiation equivalent to the $2p^2P$-$1s^2S$ 121.6 nm Lyman alpha transition in hydrogen.

An estimate of the pulsed source efficiency is as follows. Estimates of the efficiency of using the $Li^{2+}$ source are done as an exemplary calculation since because the $Li^{2+}$ source will produce the highest efficiency of the four proposed sources based upon its operation in the lowest ionization stage of the four sources. The efficiency of the $Li^{2+}$ source will be obtained by first estimating the energy $E_r$ radiated from a $Li^{2+}$ plasma for a pulse duration $\Delta\tau_p$ using a collisional radiative hydrogen-like plasma model. Then an estimate of the minimum input energy $E_{in}^{min}$ required to produce such a plasma for that duration based upon considerations of the energy required to heat the electrons and ions and also to raise the internal energy to the appropriate ion stage, is determined if this input energy is realizable in the laboratory. $E_{in}^{min}$ is then compared to some experimental estimates of input energy based upon the voltage and current required to produce such plasmas. The maximum efficiency $\epsilon_{max}$ defined as $\epsilon_{max}=E_r/E_{in}^{min}$ is then computed as a function of electron density.

A specific plasma model for $Li^{2+}$ in which the population in the first excited state (the resonance level) is computed as a function of plasma electron density n(e) and temperature T. The optimum plasma temperature will be determined as that which produces the maximum population in the resonance level for a given plasma electron density. The power and energy radiated from the resonance level can then be calculated as a function of electron density assuming that the plasma is optically thin. Then the effects of plasma opacity on efficiency will be considered.

Using the hydrogen-like plasma model first developed by Bates, Kingston and McWhirter, in "Recombination Between Electrons and Atomic Ions", Proc. Roy. Soc. A267, 297 (1962) and the refinements made to include excited state populations by McWhirter and A. G. Hearn, in "A Calculation Of The Instantaneous Population Densities of the Excited Levels Of Hydrogen-Like Ions In A Plasma", Proc. Phys. Soc., 82, 641 (1963), we can obtain a plot of the resonance level population n(2) of hydrogen-like $Li^{2+}$ ion vs. plasma temperature T for a range of electron densities n(e). The populations of $Li^{2+}$ and $Li^{3+}$ ground state ions as a function of temperature were approximated from House, in "Ionization Equilibrium Of The Elements From H to Fe", Astrophysical Journal Supplement 7, 307 (1963).

The power radiated Pr from level 2 would then be determined from $$P_r = n(2) V A_{21} h v_{21} \quad (1)$$

where V is the plasma volume, $A_{21}$ is the radiative transition probability from level 2 to level 1, h is Planck's constant and $v_{21}$ is the frequency of radiation on the 13.5 nm transition. The energy radiated $E_r$ for a plasma emission duration of $\Delta \tau_p$ could then be expressed as $$E_r = n(2) V A_{21} h v_{21} \Delta \tau_p \quad (2)$$

Figure 3:
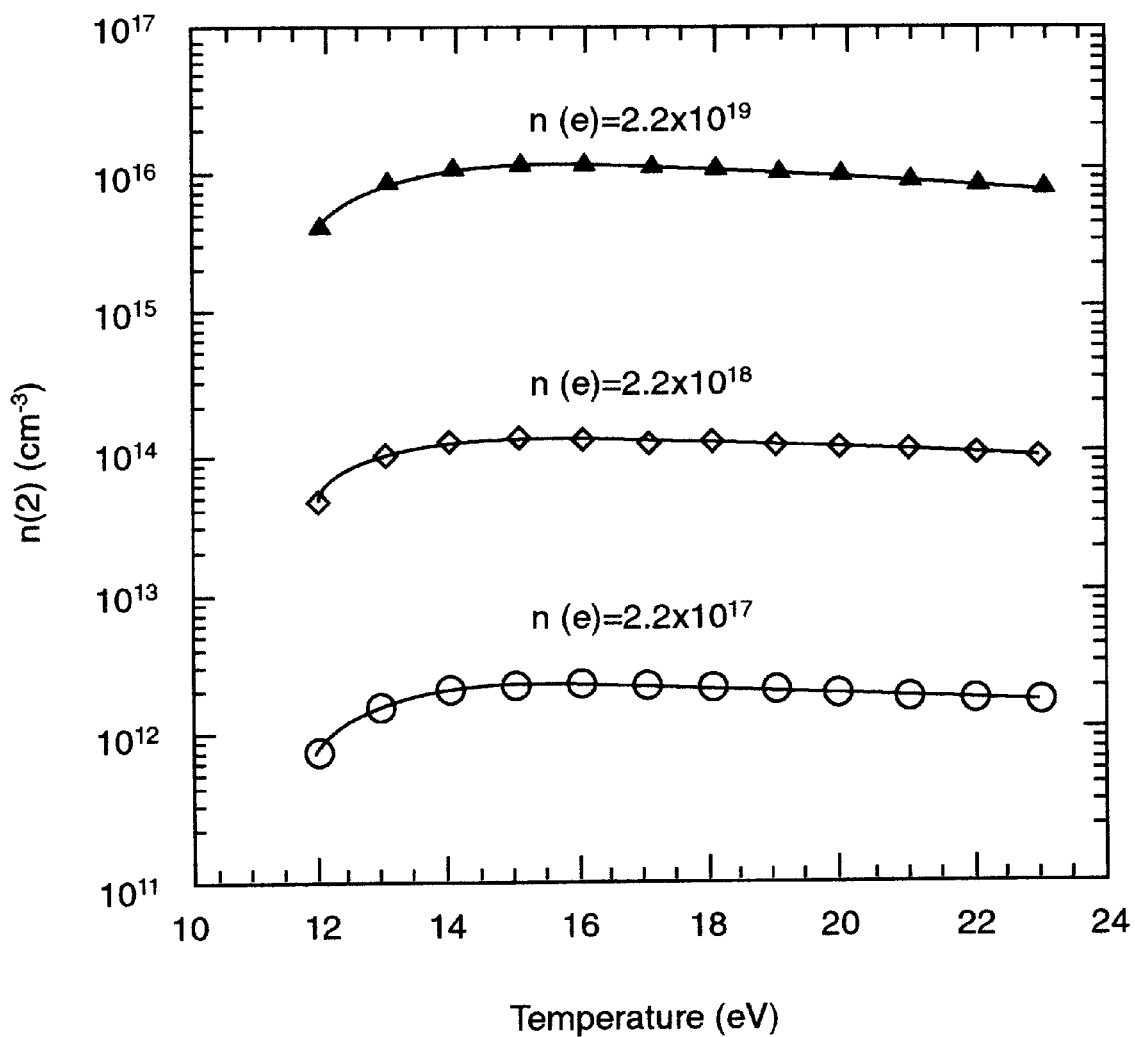
FIG. 3 shows a plot of the resonance level of lithium vs. plasma temperature T for a range of electron densities.
Figure 4:
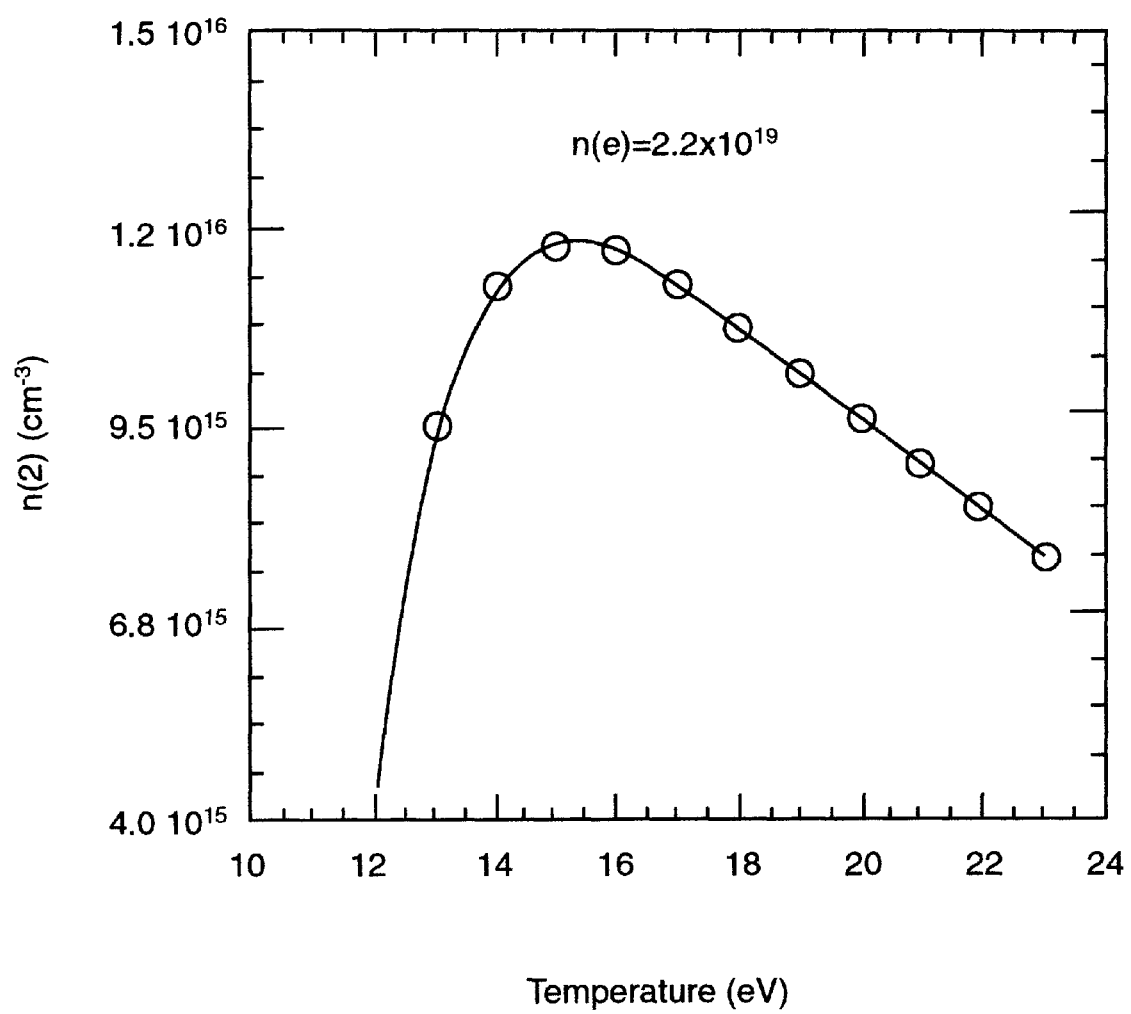
FIG. 4 shows a specific curve indicating the plasma temperature where lithium is optimized.
Figure 5:
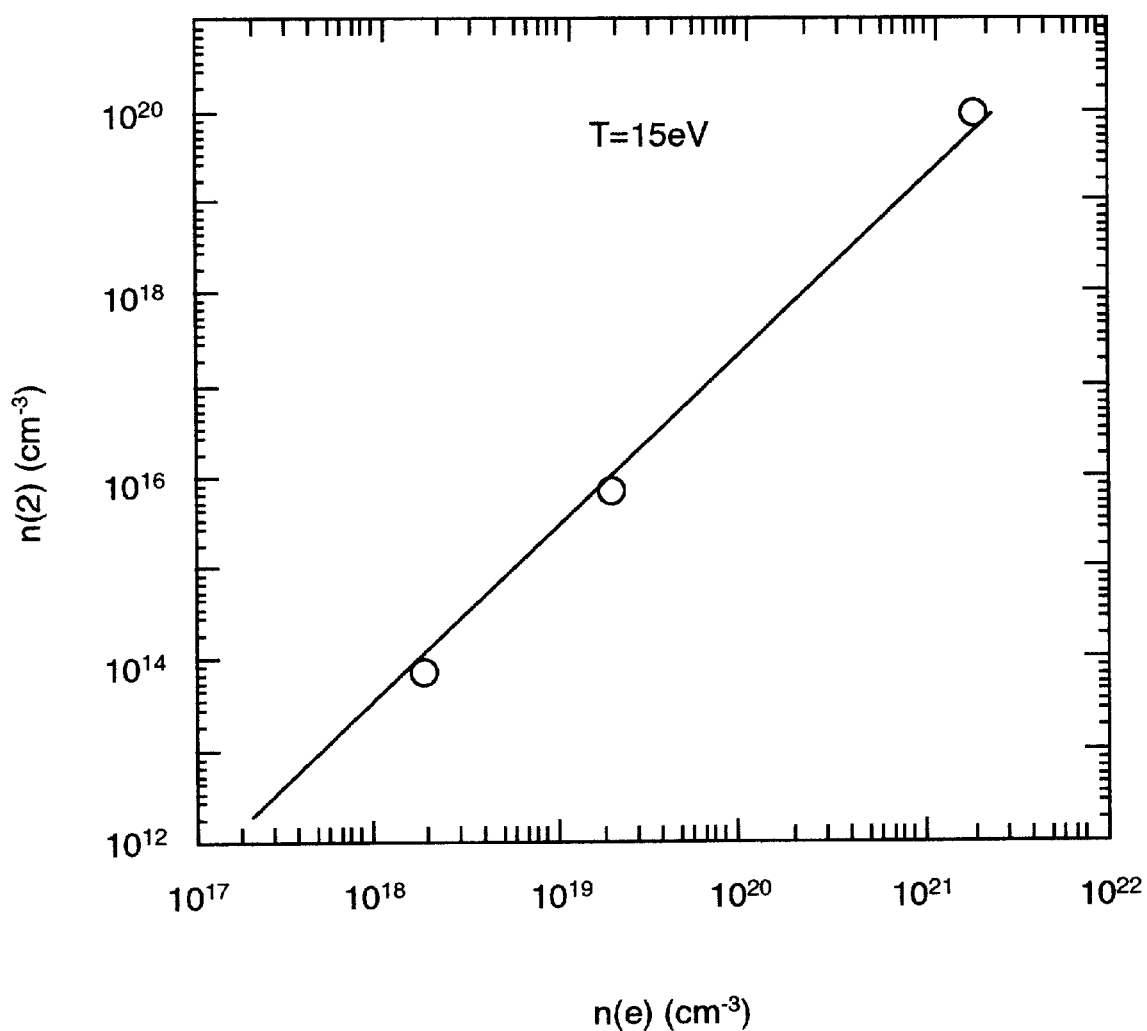
FIG. 5 shows a plot of the radiating energy level population density verses the plasma electron density.

FIG. 3 shows a logarithmic plot of n(2) versus plasma temperature T for a range of electron densities. FIG. 4 shows a more detailed curve at $n(e)=2.2 \times 10^{19}/cm^3$ indicating that n(2) is optimized at a plasma temperature of approximately 15 eV or 175,000 K. This optimum temperature was typical for all n(e) investigated. A plot of n(2) vs. n(e) at T=15 eV is shown in FIG. 5. It can be seen that n(2) increases approximately as the square of the electron density, which is not surprising since the population in level 2 is proportional both the ground state ion density $N^{2+}$ of $Li^{2+}$ and to n(e), and since $N^{2+} \approx n(e)/2$, we find that $n(2) \, n(e)^2$.

Figure 6:
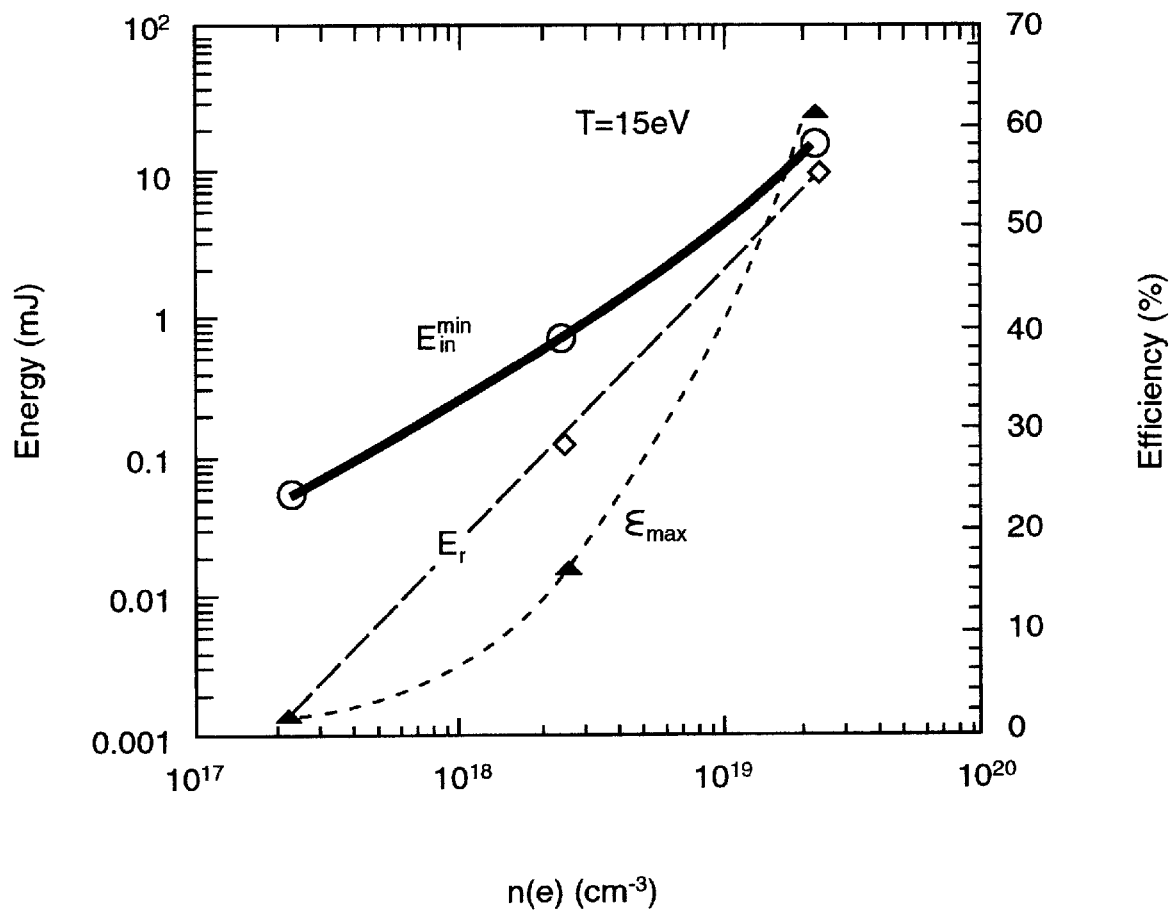
FIG. 6 shows a plot of the radiation efficiency verses plasma electron density.

The value of n(2) vs. n(e) of FIG. 5 can be used to generate $E_r$ for the 13.5 nm transition in $Li^{2+}$ from Equation (2). It is assumed that the plasma is generated in a small cylindrical volume of 125 μm radius by 250 μm length, or a volume of $V=1.2 \times 10^{-5}$ cm$^3$ which is a typical source size of laser-produced plasmas and a desirable size for use with soft-x-ray imaging optics. Thus for $A_{21}=3.8 \times 10^{10}$/sec, and $hv_{21}=91.8$ eV$=1.5 \times 10^{-17}$ J, $E_r$ can be computed for a plasma emission duration $\Delta \tau_p$ of 100 nsec to simulate a realistic low-inductance discharge pulse. The energy $E_r$ is shown in FIG. 6 for the volume $V=1.2 \times 10^{-5}$ as a function of n(e).

The input energy $E_{in}$ required to heat the plasma to the $Li^{2+}$ ionization stage and to produce the radiating species in the first excited state of that ionization stage will now be estimated. In the plasma volume V mentioned above, the number of electrons would be n(e) V and the number of ions would be $N^{2+}$ V each with an energy of (3/2)kT. The ionization energy required to reach the $Li^{2+}$ ion ground state (per ion) would be $$E_I = \sum_{i=1}^{2} E_{IP} = 5.4 eV + 75.6 eV = 8.10 eV$$

for the first two ionization energies of Li. Also, the energy required to excite the population up to level 2 for a plasma duration $\Delta \tau_p$ would be equal to the energy radiated from level 2 or $n(2) V A_{21} h v_{21} \Delta \tau_p$ for the ideal situation involving 100% excitation and radiating efficiency from the $Li^{2+}$ ground state to the resonance state and back to the ground state. The actual efficiency for this process is probably not too much less than 100% based upon the efficient operation of the mercury and sodium resonance lamps which operate by an identical process.

Thus the minimum input energy $E_{in}^{min}$ required to produce the number of ions in volume V for a duration $\Delta \tau_p$ would be $$E_{in}^{min} \approx n(e) V (3/2) kT + N^{++} V (3/2) kT + N^{++} V E_I + n(2) V A_{21} h v_{21} \Delta \tau_p \quad (3)$$

Since for plasma neutrality $N^{++} = n(e)/2$ we have $$E_{in}^{min} = \left\{ n(e) \left[ \left( \frac{9}{4} \right) kT + \frac{E_I}{2} \right] + n(2) A_{21} h v_{21} \Delta \tau_p \right\} V \quad (4)$$

For kT=15eV, $E_I$=81eV, and V=1.2×10$^{-5}$ cm$^3$, $E_{in}^{min}$ is shown plotted as a function of n(e) in FIG. 6. $E_{in}^{min}$ represents the minimum amount of energy necessary to produce a plasma of $Li^{2+}$ of volume V with the optimum density in the radiating state (the first excited state). The maximum theoretical efficiency $\epsilon_{max}$ for an optically thin plasma can thus be computed by dividing $E_r$ by $E_{in}^{min}$ or $\epsilon_{max} = E_r/E_{in}^{min}$ which is also shown plotted in FIG. 6. We can see that $\epsilon_{max}$ increases super-linearly with n(e). For example at $n(e)=10^{19}$/cm$^3$ we can see that $E_r$=1.72 mJ and $E_{in}^{min}$=4.1 mj and therefore $\epsilon_{max}$=42%. Thus, it appears that it would be desirable to operate at as high an electron density as possible in order to increase the efficiency and also the energy per pulse. We will see later that this efficiency is limited by the plasma opacity. For plasmas of this size and electron density the plasma becomes optically thick and the emission will eventually broaden beyond the acceptable bandwidth of the soft-x-ray optics. I estimate that this will occur for $n(e) \approx 10^{19}$/cm$^3$ and thus $\epsilon_{max}$ in FIG. 6 is not realistic for n(e) values higher than this.

The estimate for $E_{in}^{min}$ obtained above does not take into account the amount of energy that might be required to maintain the plasma in the $Li^{2+}$ ionization stage for any specific duration $\Delta \tau_p$ such that level 2 will continue to radiate. However, for short pulse durations of the order of 100 nsec, this estimate may be sufficient. In order to see if this calculation is realistic, we will compare $E_{in}^{min}$ with some experimental estimates of the energy input that we believe would be required to produce such a plasma. Experiments by J. Rocca, M. C. Marconi and F. G. Tomasel, in "Study Of The Soft X-Ray Emission From Carbon Ions In A Capillary Discharge", IEEE J. Quant. Electron. 29, 182 (1993), to make short wavelength lasers in pulsed capillary discharges in materials such as lithium, carbon and other materials, have produced 1 cm long, 0.5 mm diameter cylindrical plasmas with temperatures as high as 66 eV and electron densities greater than $10^{19}$/cm$^3$. Such plasmas were obtained by applying a high current through the capillary under conditions of vacuum or very low pressure gas. The current was provided by discharging a low inductance capacitor through the capillary with a capacitance ranging from 5–100 nF initially charged to voltages of up to 40 kV.

Based upon these results and knowledge of requirements for other plasma discharges, we estimate that a 250 μm long 125 μm diameter $Li^{2+}$ plasma with a temperature of 15 eV could be produced with an electron density of up to $10^{19}$/cm$^3$ by discharging a 0.1–1 nF capacitor initially charged to a voltage of 10 kV. If we assume the lowest capacitance and a 100 nsec duration plasma pulse, the plasma would have a current of 15 A (>30,000 A/cm$^2$) and an energy input $E_{in}$ of 5 mJ which is not much higher than that estimated in FIG.

6 for $E_{in}^{min}$. If higher capacitances and voltages are require, the efficiency would of course be reduced proportionately.

In order to compare these efficiencies to that produced by a laser produced plasma we would have to reduce $E_r$ by a factor of 2 to simulate the $2\pi$ steradian solid angle of a laser plasma. This would lead to a conversion efficiency of 21% compared to the projected best laser plasma efficiencies of from 0.1% to 0.2%. We are thus estimating a possible increase in the conversion efficiency of up to a factor of several hundred for the lithium source as compared to the best projected laser plasma source (based upon an optimistic 10% efficient YAG laser).

A laser produced Sn plasma might produce as much as 10 mJ/pulse within the bandwidth of a multilayer mirror from a plasma volume with dimensions of 250 $\mu$m. This is based upon an input laser energy of 1 J/pulse and a conversion efficiency from laser input to radiation into a $2\pi$ steradian solid angle of 1%[6]. The plot in FIG. 5 for $E_r$, indicates that the $Li^{2+}$ source would radiate approximately 4 mJ/pulse into a $4\pi$ solid angle or 2 mJ/pulse into a $2\pi$ solid angle at $n(e)=1.4\times10^{19}/cm^{-3}$ for the same size plasma. Thus to produce the equivalent average flux from the same volume as that from the laser plasma, the discharge plasma source would have to be operated at a repetition rate 5 times higher than the laser plasma or 5 kHz. From FIG. 6 we can see that the input energy/pulse for those conditions would be approximately 8 mJ. The total average input power based upon $E_{in}^{min}=8$ mJ and a 5 kHz repetition rate would be 40 W. This is a dramatic difference from the 50–100kW or more required to operate a 1 kHz, 1 J/pulse YAG laser.

For such discharge heated plasmas, losses will always occur at electrodes and other components associated with the plasma production. For the mercury and sodium discharge lamps this extraneous loss only amounts to 30%. It may be possible that such a low additional loss might also be achieved in these higher ionized plasmas. Also, it is not known whether a small plasma volume of the order of 250 $\mu$m dimensions can be excited to the required temperature and density. Larger plasma volumes with dimensions of up to 1 mm may have to be generated. The plasma would still radiate with the same total efficiency but the useful plasma volume for some applications would be smaller and thus the useful conversion efficiency would be reduced. Nevertheless the efficiency would still be much higher than that of a laser plasma source and the entire source apparatus would be much simpler than a combined laser and plasma design.

The Doppler width of the 13.5 nm $Li^{2+}$ transition, at a plasma temperature of 175,000 K, would be 0.0015 nm which is approximately a factor of 400 narrower than the bandwidth of typical multilayer high-reflecting mirrors. We do not expect significant Stark broadening for this transition. We must however consider opacity broadening. The absorption cross section for the $Li^{2+}$ source at 13.5 nm is $4\times10^{-15}$ cm$^2$. Thus if the plasma is operated at an electron density of $10^{19}$ cm$^3$, the $Li^{2+}$ ground state density would be of the order of $5\times10^{18}/cm^3$ and thus the plasma would be optically thin for depths of the order of 1 $\mu$m. However the plasma emission on the desired resonance transition could broaden by a factor of 400 due to radiation trapping and still fall within the multilayer mirror bandwidth. The effect of opacity broadening would reduce the effective decay rate in Equations (1) and (2) but it would also increase n(2) by approximately the same factor thus maintaining the same emission rate as estimated from Equation (2). Thus plasma sizes of up to 400 $\mu$m may still provide the same efficiency of emission that lies within a multilayer mirror bandwidth for an opacity broadened line as for an optically thin plasma.

Such dimensions are larger than the 250 $\mu$m source discussed in this paper and thus opacity broadening should not be a problem. The next section will describe identifying continuous wave sources in plasmas.

CONTINUOUS DISCHARGE SOURCES

Similar to identifying pulse sources in plasmas, two steps are required for identifying continuous wave sources in plasmas.

(1) Recognize an ion species with a resonance transition that has a high ratio of photon energy to ionization potential of that particular ion species to minimize wasted excitation; and (2) Identify an ion species having the fewest number of electrons removed from the atom, thereby minimizing the energy required to heat the total number of ions and free electrons of the plasma.

For these steps, lithium again was chosen to exemplify a continuous discharge source.

The First Step is satisfied by choosing hydrogen-like species in which the energy of the resonance transition comprises 75% of the ionization energy of the atom. The wavelength of transitions associated with resonance lines of H-like ions can be expressed as $\lambda_{res}=121.6$ nm/$Z^2$ where Z is the charge on the nucleus of the ion.

In satisfying the second step I want Z to be a minimum since the factor (Z–1) represents the number of free electrons per ion of the desired radiating species produced in the plasma for H-like ions (assuming charge neutrality). For Z=3, the source occurs in a doubly ionized Li plasma ($Li^{2+}$) and radiates at 13.5 nm as shown in FIG. 2. Other possible sources operating at shorter wavelengths are also shown in FIG. 2.

The flux radiating at 13.5 nm from the $Li^{2+}$ source is estimated by calculating the power radiated from the resonance level for a specific plasma volume. These calculations were made by using a collisional-radiative hydrogen-like plasma model first developed by Bates, Kingston and McWhirter in "Recombination Between Electrons and Atomic Ions", D. R. Bates, A. E. Kingston and R. W. P. McWhirter, Proc. Roy. Soc. A267, 297 (1962). The refinements made to include excited state populations were developed by McWhirter and Hearn in "A Calculation Of The Instantaneous Population Densities of the Excited Levels Of Hydrogen-Like Ions In A Plasma", R. W. P. McWhirter and A. G. Hearn, Proc. Phys. Soc., 82, 641 (1963).

The populations of $Li^{2+}$ and $Li^{3+}$ ground state ions as a function of temperature were approximated from House in "Ionization Equilibrium Of The Elements From H to Fe", L. L. House, Astrophysical Journal Supplement 7, 307 (1963). The population density n(2) of the $Li^{2+}$ resonance level obtained from these calculations is shown in FIG. 3 as a function of plasma temperature for a range of electron densities and in FIG. 4 for a specific electron density of $n(e)=2.2\times10^{17}/cm^3$. The optimum plasma electron temperature for a continuous discharge source is 15 eV, which is the same as for a pulsed source. The power radiated can be estimated from the simple relationship $$P_r = n(2) V A_{21} h\nu_{21} \qquad (1)$$

For a cylindrical volume of dimensions of 250 um (V=1.2× $10^{-5}$ cm$^3$), chosen to approximate the size of a laser-produced plasma source, the power radiated into $2\pi$ steradians (to be able to compare with that emitted from a laser plasma) as a function of electron density is shown in FIG. 5. The source will produce 0.02 W at an electron density of $n(e)=10^{16}/cm^3$ and over 2W at $n(e)=10^{17}/cm^3$.

Continuous argon ion lasers have operated at electron densities of up to $n(e)=5\times10^{15}1\text{cm}^3$ at electron temperatures of up to 7-8 eV as described in "An Experimental Investigation of Partial LTE for Lower Excited Levels of Ar(I) in a Wall-Confined, Argon Arc Plasma", H. Shingo and S. Imazu, J. Quant. Spectrosc. Radiat. Transfer, 23, 605 (1980). Other wall confined continuous argon arc discharges have been operated at electron densities of $n(e)=3\times10^{16}/\text{cm}^3$ so it appears that a continuous electron density of $n(e)=10^{17}/\text{cm}^3$ might be achievable.

The energy level arrangements of lithium atoms and ions are conducive to producing the necessary electron temperature of 15 eV as discussed in "Basic Data of Plasma Physics", Second Edition, S. C. Brown, The MIT Press, Cambridge Mass. (1967),. The ionization process would take place in two steps. The first would be to produce single ions of lithium. The first ionization potential is 5.4 eV and thus all of the lithium atoms should be readily ionized in the discharge. The second step is to produce double ions. The first excited state of the He-like $Li^+$ ion is over 60 eV above the ion ground state. Since the average electron energy is determined by this energy gap, an average electron energy of 15 eV should readily be obtained to provide the necessary electron temperature required for the $Li^{2+}$ source. As discussed in "Laser-Produced Plasmas for Soft-X-Ray Projection Lithography," W. T. Silfvast, M. C. Richardson, et.al., J. Vac. Sci. Technol. B10, 1 (1992), an equivalent ratio of average electron energy to excited state energy of 1:4 is readily achieved in a helium discharge.

DISCHARGE SOURCE APPARATUS

FIGS. 7 through 10 illustrate various discharge source apparatus that utilize for example, doubly ionized lithium as the light source.

Figure 7:
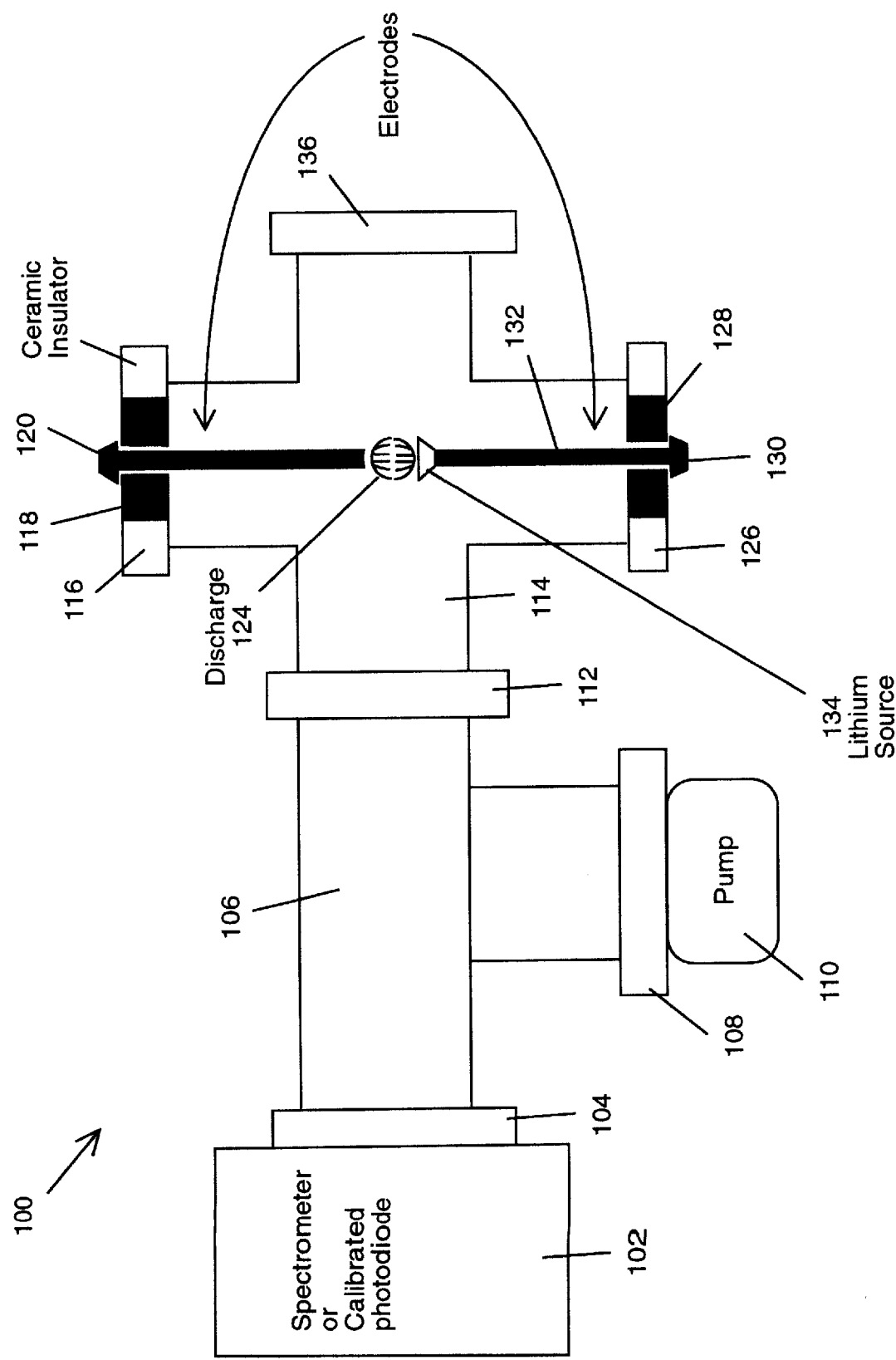
FIG. 7 shows an experimental discharge chamber for producing a pulsed lithium plasma discharge source.

FIG. 7 shows an experimental discharge chamber for producing a pulsed lithium plasma discharge source. The various elements that make up the chamber are now described. Element 102 is a spectrometer or calibrated photodiode. 104 is a connecting flange. 106 is a pump manifold. 108 is a connecting flange. 110 is a pump such as a turbo molecular pump. 112 is a connecting flange. 114 is a source chamber. 116 is a connecting flange. 118 is a ceramic insulator. 120 is an electrical connector. 122 is an anode. 124 refers to the plasma discharge. 126 is a connecting flange. 128 is a ceramic insulator. 130 is an electrical connector. 132 is an cathode. 134 is a pool of liquid or solid Lithium source.

In reference to FIG. 7, the pump 110 is used to evacuate the chamber of air since air is not compatible with lithium since air oxidizes the lithium. The spectrometer and calibrated photodiode 102 are used to evaluate the emission intensity and spectrum from the lithium plasma source. The lithium pulsed plasma discharge 124 occurs between the two electrodes 122 and 132 which serve as the anode and cathode respectively. A high voltage is applied at connecting points 120 and 130 to cause a current to flow in the discharge region 124. The ceramic insulators 118 and 128 serve to electrically isolate the high voltage pulsing system from the ground potential.

The lithium is introduced into the plasma in several different ways including:

1. Heating the chamber to the required lithium vapor pressure or from 10–760 Torr lithium or a temperature range of 900 to 1300° C.
2. Using the arrangement of FIG. 8*a* in which the lithium is vaporized from a liquid bath of lithium 210 to form the lithium plasma 206 between the anode pin 204 and the liquid bath of lithium 210. In FIG. 8*a*, element 202 is a liquid bath cathode of lithium. 204 is a anode pin made up of material such as tungsten. 206 is a lithium plasma. 208 is an insulator such as a high temperature ceramic material. 210 is liquid lithium.
3. Using an arrangement of FIG. 8*b* in which an annular capillary 304 composed of an insulating material such as silicon, silicon nitride or silicon carbide (preferably non-oxygen containing material) forms the confining region for the pulsed discharge. An annular anode 308 or an anode pin (not shown) composed of a high temperature material such as tungsten serves as the anode or positive voltage terminal of the pulsed source. In FIG. 8*b*, element 304 is an insulator such as a high temperature ceramic material. 306 is an annular cathode such as tungsten. 308 is an annular anode such as tungsten. 310 is the lithium plasma 312 is lithium in either solid or liquid form. 314 is an insulator such as a ceramic material. An annular cathode 306 or a cathode pin or hot cathode filament composed of tungsten serves as the cathode or negative electrical terminal of the pulsed lithium source. The lithium could be introduced into the annular region as shown in FIG. 8*b* by having a liquid pool or a solid rod of lithium 312 surrounded by an insulating material. The lithium is continually supplied to the annular region while the discharge is pulsing.
4. A narrow liquid lithium pin in FIG. 8*c* that is similar in most respects to the liquid lithium bath of FIG. 8*a* except that is a narrow pin of lithium 706 rather than a large liquid bath 210. It is surrounded by an insulating material that is preferably non-oxygen containing material since oxygen reacts with lithium to oxidize it. In FIG. 8*c*, element 402 is an anode pin such as tungsten. 404 is a lithium plasma. 406 is liquid lithium. 408 is an insulator such as a high temperature ceramic material. The anode pin 402 and the lithium plasma 404 are similar to those of FIG. 8*a*.
5. The electrode arrangement of FIG. 8*d* is similar to those of FIGS. 8*c* and 8*a* with the exception that a solid pin lithium cathode 506 is used to provide the lithium vapor and also serve as the cathode. Lithium should be a good cathode material since metal has a very low ionization potential and work function and thus should be a good emitter of electrons. Lithium should also vaporize easily for the same reason. In FIG. 8*d*, element 502 is an anode pin such as tungsten. 504 is lithium plasma. 506 is solid lithium. 508 is an insulator such as a high temperature ceramic material. 510 is an extruding device. An extruding device as indicated in FIG. 8*d* would push the lithium upward as it is used up during the pulsing process to provide new lithium material as needed since the lithium would be vaporized to form the discharge and then dissipate out of the plasma source region.

Figure 9A:
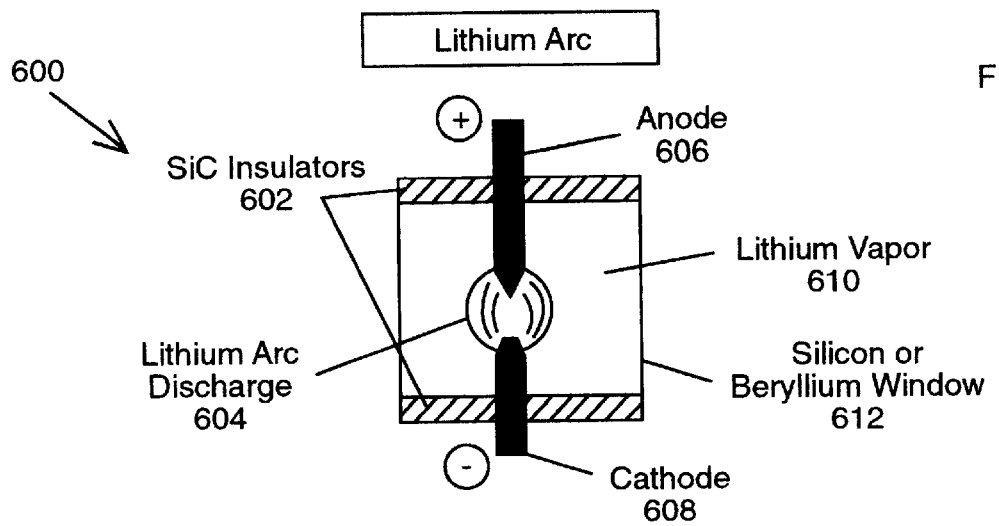
FIG. 9a shows a lithium arc discharge source.
Figure 9B:
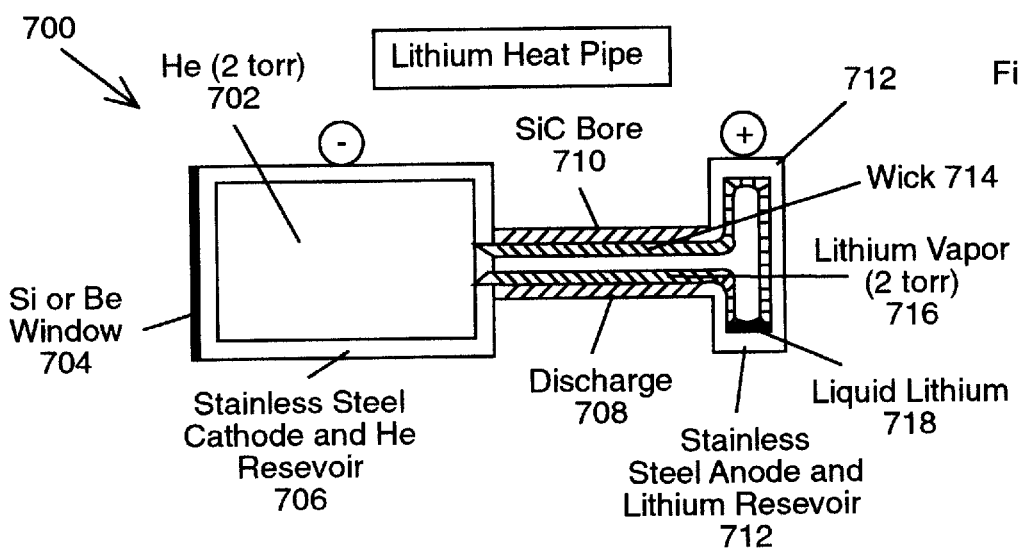
FIG. 9b shows a lithium heat pipe source.
Figure 9C:
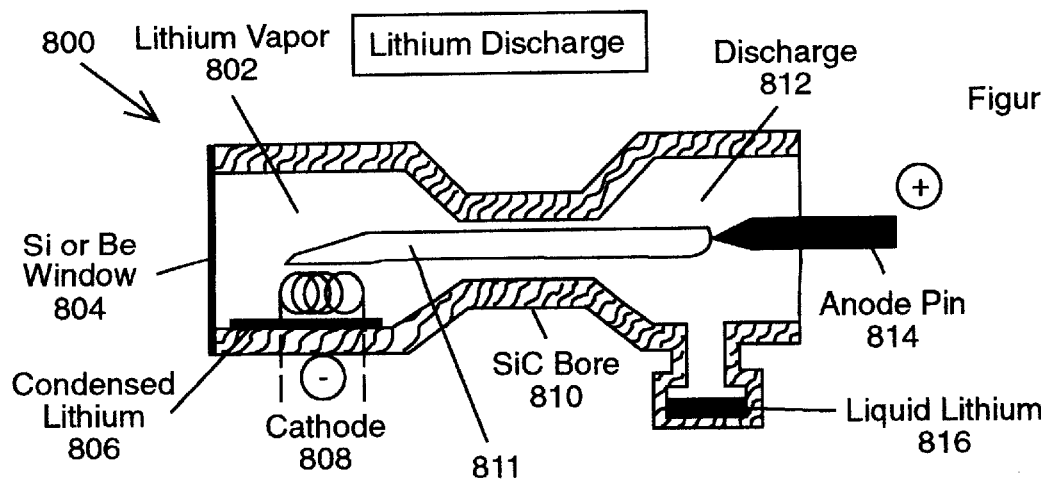
FIG. 9c shows a lithium discharge source.

FIGS. 9*a* through 9*c* show three embodiments of a continuous lithium discharge source. In all three embodiments the lithium would have to be heated to a temperature in the region of 625 to 900° C. corresponding to a lithium vapor pressure of from 0.1 to 12 Torr to provide the appropriate number of lithium ions for the discharge.

FIG. 9*a* shows a lithium arc discharge in which there is a discharge source chamber 600 that is composed of insulating materials 602 such as silicon carbide (non-oxygen containing materials) with a silicon or beryllium window 612 to let the 13.5 nm plasma emission exit from the lamp. The window 612 would be a silicon or beryllium material of an approximate thickness of 0.5 to 2 micrometers thick so as to allow applicable transmission of the 13.5 nm light. The discharge region in the form of an arc discharge 604 is composed of an anode pin 606 and a cathode pin 608 across which a high voltage is initiated. The region 610 between the anode 606 and cathode 608 pins as well as other regions within the chamber 600 is filled with lithium vapor 610 at the necessary temperature as described above for a continuous lithium discharge source. The lithium arc discharge plasma 604 occurs in the region 610 between the anode pin 606 and the cathode pin 608 as shown in FIG. 9a.

FIG. 9b shows a lithium heat pipe discharge source 700. The lithium pipe discharge source is used if it is desirable to keep the silicon or beryllium window 704 at a cool temperature relative to the hot temperature required for the lithium discharge. In such a configuration the cool region 702 is filled with helium at the same pressure as that desired for the lithium vapor 716 in the hot region. The liquid lithium 718 is then vaporized by heating the discharge region 708 to a temperature at a desired vapor pressure. The lithium vapor 716 will fill the discharge region and will condense at the end of the discharge region 708 and flow back to the liquid lithium source 718 via the wick material 714 such as stainless steel or nickel. The silicon or beryllium window 704 are of the same thickness as described above for the lithium arc discharge of FIG. 9a. A discharge current is operated through the discharge region 708 from the anode 712 to the cathode 706.

FIG. 9c shows a lithium high temperature discharge source 800 that operates by injecting the lithium 816 into the anode region 814 and allowing it to flow into the discharge bore region 810. The bore region 810 would be composed of an insulating material 811 such as silicon carbide. An anode pin 814 would serve to introduce the high voltage to cause current to flow from the cathode 808 to the anode 814. The cathode 808 can be a solid cathode or a hot filament type cathode. A silicon or beryllium window 804 would allow the 13.5 nm plasma emission from the lithium discharge plasma 812 to exit the source region at the cathode end 808 of the discharge assembly 800. In this version, liquid lithium 816 would condense in the cathode region 808 after it flows via cataphoresis from the anode region 814.

Figure 10:
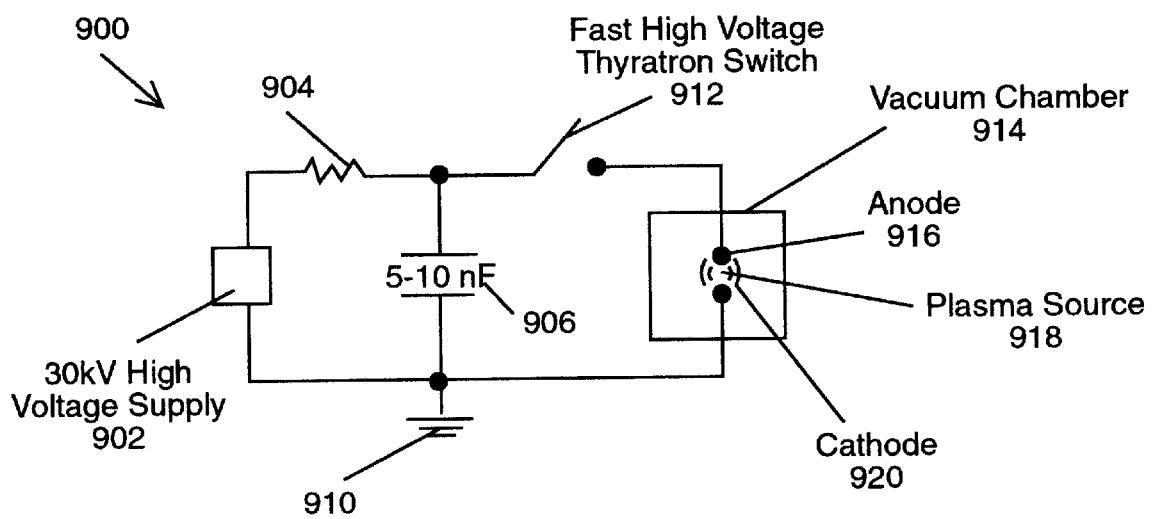
FIG. 10 illustrates a circuit for DC discharge excitation.

FIG. 10 illustrates a circuit 900 for DC discharge excitation that can be used with the above apparatus. Element 902 is a 30 kV High Voltage Supply. 904 is a resistor such as 10,000 ohms. 906 is a high voltage capacitor of 5 to 10 nF. 910 shows a ground connection. 912 shows a fast high voltage thyratron switch. 914 shows a vacuum chamber such as the one shown in FIG. 5. 916 is an anode such as tungsten. 918 is a lithium plasma source. And element 920 is a cathode such as tungsten.

METAL AND CERAMIC LAMP CHAMBER LIGHT DISCHARGE SOURCES

A metal and ceramic lamp chamber can be used in which the metal end regions serve as the electrodes. In addition, these electrodes have a dual function in that one serves as a lithium reservoir which houses molten lithium, and the other function is as a lithium condenser which collects cooled lithium vapor generated in the reservoir region. The ceramic bore serves as the discharge region. Combining metal and ceramics together is shown in the following FIGS. 11a, 12 and 13, which will be described in greater detail later. Various ceramic materials have been further shown to be compatible with liquid lithium. See for example Singh, R. N., "Compatibility of Ceramics with Liquid Na and Li", Journal of the American Ceramic Society", Vol. 59, No. 3-4 March-April 1976, pages 112–114.

In the subject invention, the ceramic insulating material must be chosen such that is compatible with lithium at 900° C. The metal material must be chosen so that it is compatible with lithium and so that the metal can be joined to the ceramic material creating a hermetic vacuum seal. Furthermore,the metal material must be robust to erosion when used as an electrode.

In the subject invention, metal and ceramic materials used(see Table 1) must have very similar thermal expansion coefficients such that when brazed together to form a vacuum tight joint, they will not break during temperature cycling from room temperature to temperatures as high as approximately 1,000° C.

TABLE 1—Metal and Ceramic Materials Combinations Useful in the Subject invention.

1. molybdenum and aluminium nitride.
2. molybdenum and silicon carbide.
3. iron and aluminum oxide.

Metal materials that are used must also be compatible with lithium as both a liquid and a vapor. Exemplary metal materials are shown in TABLE 2.

TABLE 2—Metal materials compatible with lithium vapor.

1. molybdenum
2. stainless steel type 304
3. zirconium
4. titanium
5. other refractory metals.

An insulating bore region, such as a ceramic material, must also be compatible with lithium vapor and also have a resistance to bore erosion in the presence of a high-voltage, high-current pulsed discharge. The following FIGS. 11a, 11b, 12 and 13 detail the ceramic insulating bores and metal electrode combinations.

Figure 11A:
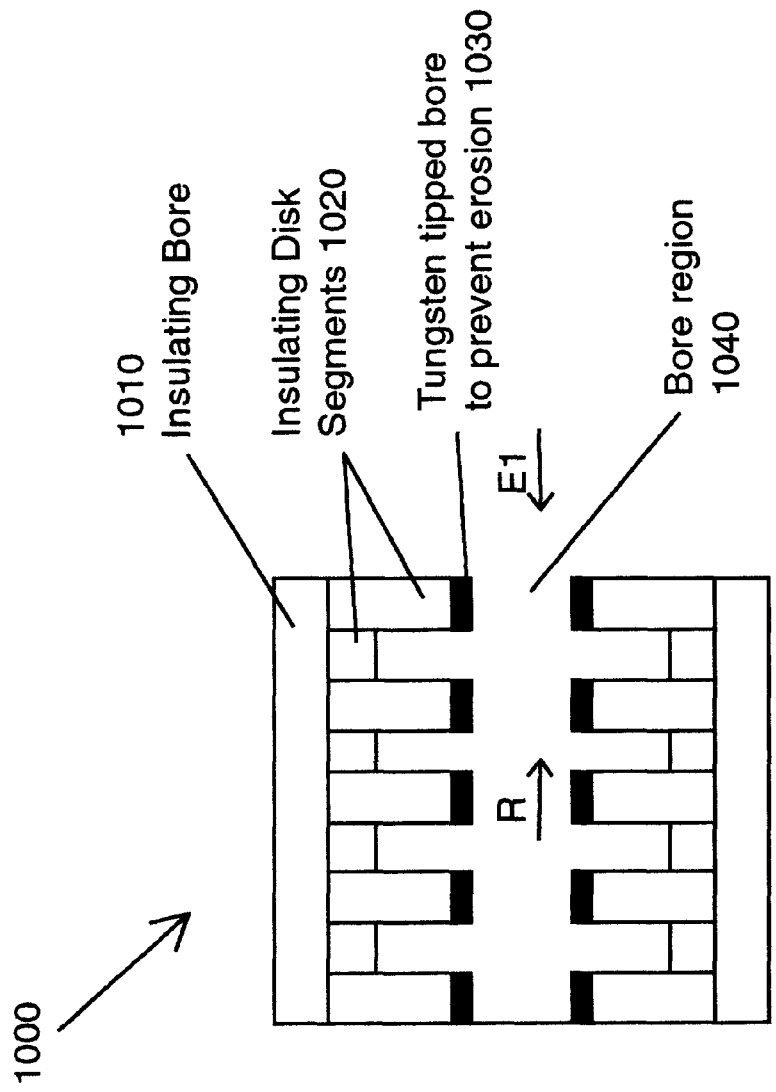
FIG. 11a shows a cross-sectional view of a segmented bore for a lithium plasma discharge source.
Figure 11B:
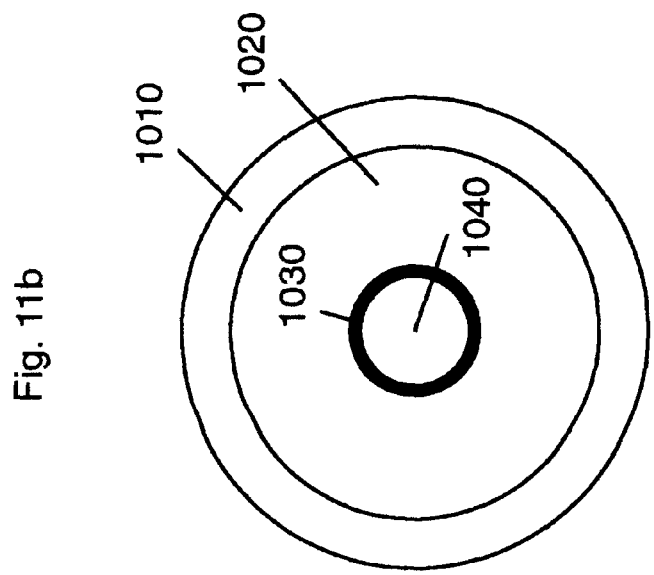
FIG. 11b shows an end view of the discharge source of FIG. 11a along arrow E1.

FIG. 11a shows a cross-sectional view of a segmented bore 1000 for a lithium plasma discharge source. FIG. 11b shows an end view of the discharge bore 1000 of FIG. 12a along arrow E1. The segmented bore 100 of FIGS. 11a-11b can be used in place of the insulating bore 1130 of FIG. 12 and in place of the insulating bore 1220 of FIG. 13, respectively. Referring to FIGS. 11a-11b, discharge bore 1000 allows a discharge to occur through a narrow bore region 1040. A cylindrical ceramic insulator 1010 chosen from the compatible ceramics previously described acts as an insulator, so that there is not a direct current path between the tips 1030. On the outer region of the bore 1040, the ceramic is continuous 1010, so that the region remains vacuum tight. The inner region of the bore 1040 consists of high melting point material tips/rings/edges 1030 of a compatible refractory metal (such as those from Table 2 above). The metal tips 1030 must be segmented so that there is not a continuous metallic conducting path through the center of the bore 1040, in which case, the current would flow through the metal 1030 rather than through a lithium plasma within the bore 1040. With the segmented metal bore, a lithium plasma will be formed along arrow R, so the that current flows through the plasma, thereby generating the double ionized species which radiates at approximately 13.5 nm and approximately 11.4 nm individually and simultaneously.

FIG. 12 shows a side cross-sectional view of metal electrodes and ceramic insulating bore combination 1100 having a recirculating lithium cell, used as a lithium plasma discharge source. Referring to FIG. 12, discharge source 1100 through a recirculating lithium cell can generate a continuous supply of lithium vapor from molten lithium 1120 by using a first cylindrical metal electrode 1110 having a closed left sidewall 1118, a closed top wall 1112, closed bottom wall 1114 and a right sidewall 116 having openings connecting to side mounted horizontal cylindrical ceramic insulators 1130 and 1140. Lower cylindrical insulator 1140 is angled upward. A second cylindrical metal electrode 1150 has a closed top end 1152, closed angled bottom end 1150 and a left sidewall 1156 opening to opposite ends of ceramic insulators 1130 and 1140. A right sidewall 1154 has a opening closed off with a silicon window 1160 from which the light source path.

The operation of FIG. 12 will now be described. The molten lithium 1120 is heated to approximately 700° C. to approximately 900° C., by a cylindrical oven chamber 1119, such as a resistance heater manufactured by Linberg Co., USA, which surrounds the components in region 1190. The heated and molten lithium 1120 generates approximately 10 Torr of lithium Vapor V1. The gas diffuses throughout the discharge bore 1130. The vapor in the discharge bore 1135 is excited by a current pulse, producing a lithium plasma that radiates at 13.5 nm through silicon window 1160. Alternatively, the lithium plasma can radiate at 11.4 nm with a Berrylium window 1160. Current flows from electrode 1110 on the left end face to electrode 1150 on the right end face of the ceramic insulator 1130, through the lithium vapor plasma 1135, within the discharge bore region 1130. Current can be approximately 3 to approximately 10 kilo amps. The vapor V2 also diffuses into the return path 1145. However, the return path has a much higher impedance than the capillary so that the discharge occurs with the discharge bore 1135 and not within the return path 1145. For example, if the length of the return path 1140 is longer than the length of the discharge bore 1130, the impedance in the return path 1140 will be higher than the impedance in the discharge bore region 1130. Thus, the longer return path length will force current to flow through the discharge bore region 1130 opposed to flowing through the return path 1140. Lithium that diffuses entirely through the bore 1135 condenses in the cold region area 1170(temperature between approximately 350 to approximately 500° C.) forming a liquid. Cold region 1170 is caused by but not limited to water filled concentric cooling coils 1159 which can be ¼" copper metal tubing with the water flowing through the tubing being less than approximately 500° C. The liquid then flows in the direction of arrow V2 into the heated region 1190 via gravitational force through the downwardly sloping liquid return insulator bore 1145, where the liquid lithium is again heated, forming a vapor V1 that diffuses throughout the entire region 1180. A silicon window 1160 located in the cold region is in line with the discharge bore 1135 so that light, L can exit the lamp.

FIG. 13 shows a side cross-sectional view of a metal electrodes and ceramics combination with a static lithium cell, used as a lithium plasma discharge source 1200. Referring to FIG. 13, discharge source 1200 includes a top cylindrical metal electrode 1210 having a top end closed off with a silicon window 1215 and an open bottom end connected to a cylindrical ceramic insulating bore 1120, the bottom of which is connected to the open top end of a lower cylindrical metal electrode 1230. Molten lithium 1240 is located on the bottom wall 1232 of lower electrode 1230.

The operation of FIG. 13 will now be described. The entire lamp 1300 is heated to approximately 900° C. Approximately 10 Torr of lithium vapor is generated at V4. The vapor then fills the entire interior volume of the lamp 1300. A discharge excites the vapor within the insulating bore 1220 generating a lithium plasma that radiates at approximately 11.4 nm and approximately 13.5 nm individually and simultaneously. A silicon window 1215 allows light L, to escape the lamp 1200. Current of approximately 3 kiloamps to approximately 10 kiloamps flows from lower electrode 1230 to top electrode 1210 through insulating bore 1225.

In both FIGS. 12 and 13, a segmented bore such as the one described in FIGS. 11a-11b can be substituted for the insulated discharge bores, respectively.

FIG. 14 shows a lithium plasma spectrum of relative intensity in Watts vs. wavelength in um. The FIG. 14 spectrum shows the lines in the 10–20 nm wavelength region. There are many other lines that occur, but since this is the region we are interested in, we only took measurements of these lines in the 10–20 nm region. The lines from doubly ionized lithium are indicated and labelled H-like (hydrogen-like). The 2-1 transition is at 13.5 nm. The 3-1 transition is at approximately 11.4 nm. The strong transitions shown as 11.4 and 13.5 nm can be used for lithography.

Although only FIGS. 11a, 11b, 12 and 13 are described as generating 11.4 nm and 13.5 nm, all the preceding lithium discharge lamps described can generate at both of these wavelengths.

Although not shown by the preceding figures, the use of krypton or helium as a buffer gas to minimize the transmission loss through the gas at the operating wavelength of 13.5 nm, can be used within the lamps. The presence of any buffer gas increases the transmission loss. The losses are least using krypton gas. Using buffer gasses can reduce the diffusion of lithium atoms to the silicon windows in the preceding figures.

Although not shown in the preceding figures, Mo:Be multilayer mirrors can be used downstream from berrylium windows in order to reflect light that emerges from the discharge lamp. The use of the lamp also at 11.4 nm in lithium vapor can operate in the 3-1 hydrogen-like lithium transition when used in conjunction with reflecting optics such as Mo:Be multilayer-coated mirrors. Likewise, Mo:Si mirrors can be used downstream from a silicon window for 13.5 nm.

While FIGS. 11a, 11b, 12 and 13 specify aluminum nitride, silicon carbide, and aluminum oxide, other compatible ceramics can be used.

Although many of the preceding figures specify lithium as the light source, these discharge sources can also be applicable to beryllium, boron and carbon.

While the invention described herein mentions application for plasma soft-x-ray and EUV lithography, these sources have application in other areas such as but not limited to microchip inspection, biological studies, interferometry, photoprocessing and illumination.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

We claim:

1. A lithium discharge source using a segmented insulating bore, comprising:
   lithium vapor;
   means for forming a conductor region; and
   a segmented insulating bore for supporting the conductor region means and the lithium vapor therebetween, wherein a lithium plasma discharge source is generated along the conductor region means within the segmented insulating bore.

2. The lithium discharge source of claim 1, wherein the segmented insulating bore includes:
   an insulated cylinder;
   first insulating disk segments within the insulated cylinder having a first diameter bore therethrough, the first insulating disk segments having interior facing conductor tips of higher melting materials; and second insulating spacer disk segments separating the first insulating disk segments from one another having a second diameter bore larger than the first diameter bore therethrough, wherein a lithium vapor is diffused in the first and the second diameter bores.

3. A method of radiating a Lithium ion plasma source at approximately 11.4 nm comprising the steps of:

forming a plasma source substantially composed of $Li^{2+}$ ions; and radiating the plasma source at approximately 11.4 nm.

4. The method of radiating the Lithium ion plasma source of claim 1, wherein the plasma further includes:

an operating electron temperature range of 12 to 20 eV; and an electron density of $10^{16}$ to $10^{21}$ $cm^3$.

5. The method of radiating the Lithium ion plasma source of claim 1, wherein the radiating source includes:

a pulsed source.

6. The method of radiating the Lithium ion plasma source of claim 1, wherein the radiating source includes:

a continuous source.

7. The method of radiating the Lithium ion plasma source of claim 1, wherein the step of radiating further includes the step of:

simultaneously radiating the plasma source at approximately 13.5 nm.

8. A lithium discharge source comprising:

lithium vapor;

metal electrodes;

a ceramic insulator for housing the lithium vapor, wherein a lithium plasma discharge source is generated in a bore through the insulator between the electrodes.

9. The lithium discharge source of claim 8, wherein the metal electrodes are chosen from:

refractory metals.

10. The lithium discharge source of claim 8, wherein the metal electrodes are chosen from:

molybdenum, stainless steel, zirconium, titanium, vanadium, and refractory metals.

11. The lithium discharge source of claim 8, wherein the ceramic insulator is chosen from:

aluminum nitride, silicon carbide, and aluminum oxide.

12. The lithium discharge source of claim 8, wherein the ceramic insulator includes:

an insulating bore region.

13. The lithium discharge source of claim 8, wherein the lithium plasma discharge source includes:

a pulsed discharge source.

14. The lithium discharge source of claim 8, wherein the lithium plasma discharge source includes:

a continuous discharge source.

15. A closed loop cycle circulation path system for a lithium discharge source, comprising:

a electrode casing;

a lithium source within the electrode casing;

an insulating bore within the electrode casing forming a discharge bore for the lithium source, the discharge bore having a first electrical impedance; and a return path through a region of a second electrical impedance, the second electrical impedance having a higher impedance than the first electrical impedance, wherein a lithium plasma is generated between the electrode casing within the insulating bore.

16. The closed loop cycle circulation path system for the lithium discharge source of claim 15, wherein the insulating bore includes:

a segmented insulating bore for supporting the lithium source.

17. The closed loop cycle circulation path system for the lithium discharge source of claim 16, wherein the segmented insulating bore includes:

an insulated cylinder;

first insulating disk segments within the insulated cylinder having a first diameter bore therethrough, the first insulating disk segments having interior facing conductor tips of high melting materials; and second insulating spacer disk segments separating the first insulating disk segments from one another having a second diameter bore larger than the first diameter bore therethrough, wherein a lithium vapor is generated in the first and the second diameter bores.

* * * * *